United States Patent
Oka et al.

(10) Patent No.: US 6,184,541 B1
(45) Date of Patent: Feb. 6, 2001

(54) THIN FILM TRANSISTOR AND METHOD OF PRODUCING THE SAME

(75) Inventors: Hitoshi Oka; Yutaka Ito, both of Toyama (JP)

(73) Assignee: Matsushita Electronics Corporation, Osaka (JP)

(*) Notice: Under 35 U.S.C. 154(b), the term of this patent shall be extended for 0 days.

(21) Appl. No.: 09/205,775

(22) Filed: Dec. 3, 1998

(30) Foreign Application Priority Data

Dec. 4, 1997 (JP) .................................................. 9-333883

(51) Int. Cl.[7] ...................................................... H01L 29/00
(52) U.S. Cl. ................................ 257/59; 257/60; 257/61; 257/62; 257/63; 257/64; 257/65; 257/55; 257/56; 257/57; 257/58; 257/347; 257/348; 257/349; 257/355
(58) Field of Search ......................... 257/55–65, 347–355

(56) References Cited

FOREIGN PATENT DOCUMENTS 5-308081    11/1993  (JP) .
09008314    1/1997   (JP) .

OTHER PUBLICATIONS

Kobayashi et al., "A Novel Fabrication Method for Poly–si TFTs with a Self–Aligned LDD Structure", Int'Conference on Solid State Devices and Materials, Aug. 1, 1992, p. 693–694.

Seki et al., "Laser–recrystallized polycrystalline–silicon thin–film transistors with low leakage current and high switching ratio", IEEE Electron Device Letters, Sep. 1987, vol. EDL–8, No. 9, pp. 425–427.

Kim et al., "Degradation Due To Electrical Stress of Poly–Si Thin Film Transistors With Various LDD Lengths", IEEE Electron Device Letters, vol. 16, No. 6, Jun. 1, 1995, pp. 245–247.

Int'l Search Report for Int'l Appln. No. Ep 98 12 2700 dated Sep. 16, 1999.

Primary Examiner—Fetsum Abraham
(74) Attorney, Agent, or Firm—Ratner & Prestia

(57) ABSTRACT

On the polycrystal semiconductor film 3 formed on the insulating substrate 1, the source 6 and drain 7 in LDD structure having a low concentration region 4 and a high concentration region 5 are formed. The region 4 has a low impurity concentration, and the region 5 has a high impurity concentration. The length of the low concentration region 4 measured from the edge of gate insulating film 9 is not smaller than the average grain size of the polycrystal semiconductor film 3. The LCD device employing the TFT thus constructed is free from white spots (micro brighter spots) in a high temperature atmosphere.

2 Claims, 4 Drawing Sheets

THIN FILM TRANSISTOR AND METHOD OF PRODUCING THE SAME

FIELD OF THE INVENTION

The present invention relates to thin film transistors (hereinafter called TFT) employed in liquid crystal display devices (hereinafter called LCD) and manufacturing method of the TFT.

BACKGROUND OF THE INVENTION

As a main stream of thin and light-weighted displays, LCD are widely used in various displaying devices such as for notebook type personal computers, portable TVs, car-mounted navigators. The LCD device is also employed in compact high resolution displays such as viewfinders of video cameras. This compact high-resolution display is utilized in video projectors that have been demanded in the market in these days.

The TFT employed in a conventional type LCD is described with reference to FIG. 4(a), a cross sectional view of the TFT, and FIG. 4(b), an enlarged top view thereof.

This TFT comprises the following elements:
(a) an insulating substrate 1 (or, an insulating film formed on a semiconductor substrate);
(b) polycrystal semiconductor film 3 having grain boundary 2, the film 3 is formed on the substrate 1;
(c) source 6 and drain 7 each having an LDD structure that comprises a low concentration region 4 where impurity concentration is low, and a high concentration region 5 where impurity concentration is high, the source 6 and drain 7 are formed in the film 3;
(d) a channel region 8 formed between the source 6 and drain 7;
(e) a gate insulating layer 9 and a gate electrode 10 formed in this order on the channel region 8;
(f) an inter-layer insulating film 11 having a contact hole and formed over the gate electrode 10.
(g) an electrode wiring layer 12 made of conductive film and formed in the contact hole; and
(h) a passivation film 13 formed on the layer 12.

In the conventional high resolution LCD device, an accurate ON-OFF characteristic of TFT switching performance is one of critical features. The accurate ON-OFF performance tells distinctly whether a voltage is supplied to a pixel electrode that applies a voltage to LCD or the voltage is not supplied, and controls a monochrome condition of every pixel, in other words, an entire display screen. In order to effect this accurate ON-OFF performance, it has been desirable that polycrystal silicon having a grain size as large as possible, e.g. 3–5 μm, is used for the polycrystal semiconductor thin film, thereby to increase an ON-current of the TFT.

The market recently demands to improve the picture quality; however, the LCD device having a conventional TFT structure encounters a problem that a large number of micro brighter spots occur when the display shows gray tone. The micro brighter spot illuminates brighter than a desired brightness, namely the micro brighter spot looks whiter than other pixels.

This problem is conditioned by two reasons. One is that TFT has been progressively miniaturized in order to gain luminance of a display screen through increasing an aperture rate of an LCD device. Another one is that an LCD device is subjected to a high temperature because the LCD is mounted to a video projector that employs brighter lamps.

A relation between the occurrence of micro brighter spot and a structure of the conventional TFT is described with reference to FIG. 4(b). In the conventional TFT shown in FIG. 4(b) employs silicon-made polycrystal semiconductor thin film of which grain size is 3–5 μm as an active layer of the TFT. The progress of TFT miniaturization entails such a phenomenon as the length "D" of each low concentration region 4 of the source 6 and drain 7 becomes shorter than the grain size. In manufacturing the TFTs, impurity ion is implanted so that the low concentration region 4 and high concentration region 5 are formed. When a heat treatment is provided for activation, highly concentrated impurity 14 implanted into the high concentration region 5 diffuses into the low concentration region 4 substantially along the grain boundary 2. At this time, since the grain size is longer than the length "D" of the low concentration region 4, the high concentration impurity 14 diffuses deeply along the grain boundary 2, thereby to shorten an effective length "d" of the low concentration region 4. As a result, an OFF effect of the TFT switching characteristic is lowered. Even the TFT is in an OFF state, when the LCD is subjected to a high temperature, a leakage current enough to produce micro brighter spots runs between the source and the drain of TFT. The micro brighter spots are thus produced.

SUMMARY OF THE INVENTION

The present invention aims to provide a small size TFT that can prevent micro brighter spots from occurring when an LCD is used in a high temperature atmosphere.

The TFT of the present invention comprises the following elements:
(a) an insulating substrate, or a semiconductor substrate on which an insulating film is formed;
(b) polycrystal semiconductor thin film formed on the insulating substrate or the insulating film, and having a source and a drain in an LDD structure that has a low concentration region where impurity concentration is low as well as a high concentration region where impurity concentration is high;
(c) a gate insulating film formed on the plycrystal semiconductor thin film; and
(d) a gate electrode formed on the gate insulating film.
The length of low concentration region measured from the edge of gate insulating film is not smaller than an average grain size of the polycrystal semiconductor thin film.

A manufacturing method of the TFT of the present invention comprises the following steps:
(i) forming an amorphous semiconductor film on one of an insulating substrate and an insulating film formed on a semiconductor substrate;
(ii) forming a polycrystal semiconductor film by providing a heat treatment to the amorphous semiconductor film;
(iii) forming a gate insulating film and a gate electrode sequentially on the polycrystal semiconductor film;
(iv) forming a source and a drain both having low impurity concentration by implanting impurity ion into the polycrystal semiconductor film across an area from the edge of gate insulating film to at least a distance of an average grain size,
(v) forming the source and the drain both having high impurity concentration by implanting the same conductive type impurity ion as used in the low concentration region into the region other than the low concentration region; and (vi) providing a heat treatment for activating the source and drain where ion has been implanted.

The above structure and method provide polycrystal semiconductor film having a small average grain size. Therefore, even if the impurity diffuses from the high concentration region into the low concentration region along the grain boundary at the heat treatment that activates the impurity, a grain boundary parallel to the gate electrode restrains the diffusion. An effective length "d" of the low concentration region is thus restrained from being shorter. Therefore, a TFT composing each pixel can be smaller in size, and the micro brighter spots in gray-tone-display can be prevented from occurring in a high temperature atmosphere because a leakage current of the TFT is restrained.

DESCRIPTION OF THE PREFERRED EMBODIMENTS

Figure 1A:
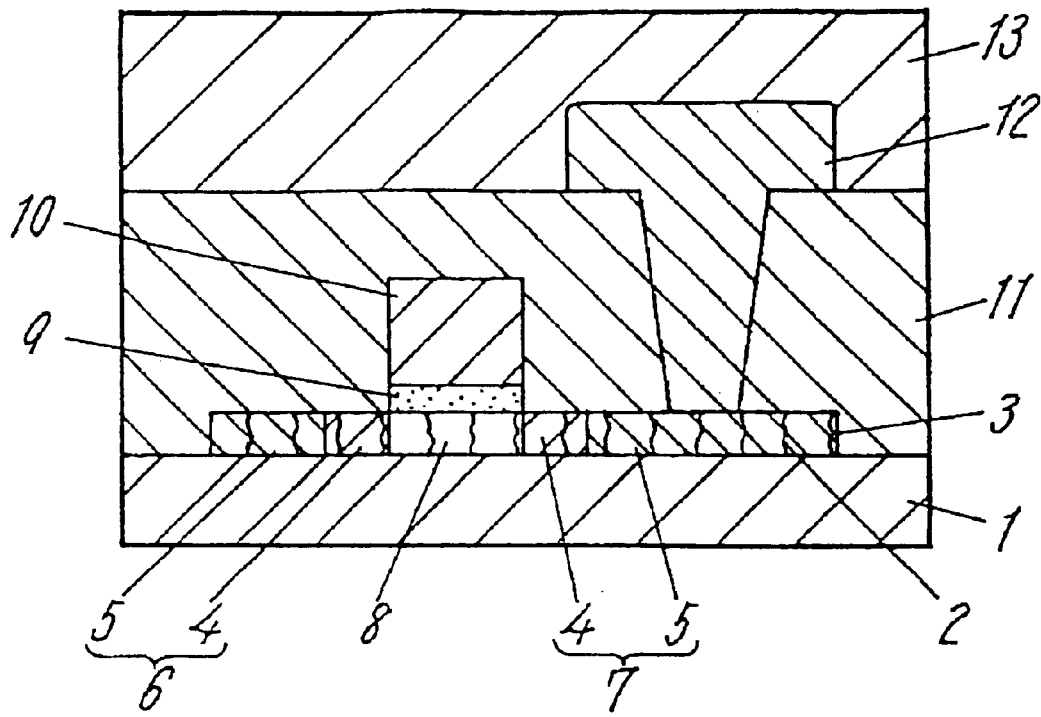
FIG. 1(a) is a cross section of the TFT used in an exemplary embodiment of the present invention.

A structure of the TFT of the present invention is described in the following exemplary embodiment with regard to FIGS. 1(a) and 1(b).

A polycrystal semiconductor film 3 having grain boundary 2 is formed on an insulating substrate 1. A source 6 and a drain 7 each of them having an LDD structure that has a low concentration region 4 and a high concentration region 5. The low concentration region 4 has a low impurity concentration, and the high concentration region 5 has a high impurity concentration. A channel region 8 is formed between the source 6 and the drain 7. A gate insulating film 9 and a gate electrode 10 are formed on the channel region 8. An inter-layer insulating film 11 having a contact hole is formed over the gate electrode 10. An electrode wiring layer 12 made of conductive film is formed in the contact hole. A passivation film 13 is formed over the electrode wiring layer 12.

Figure 1B:
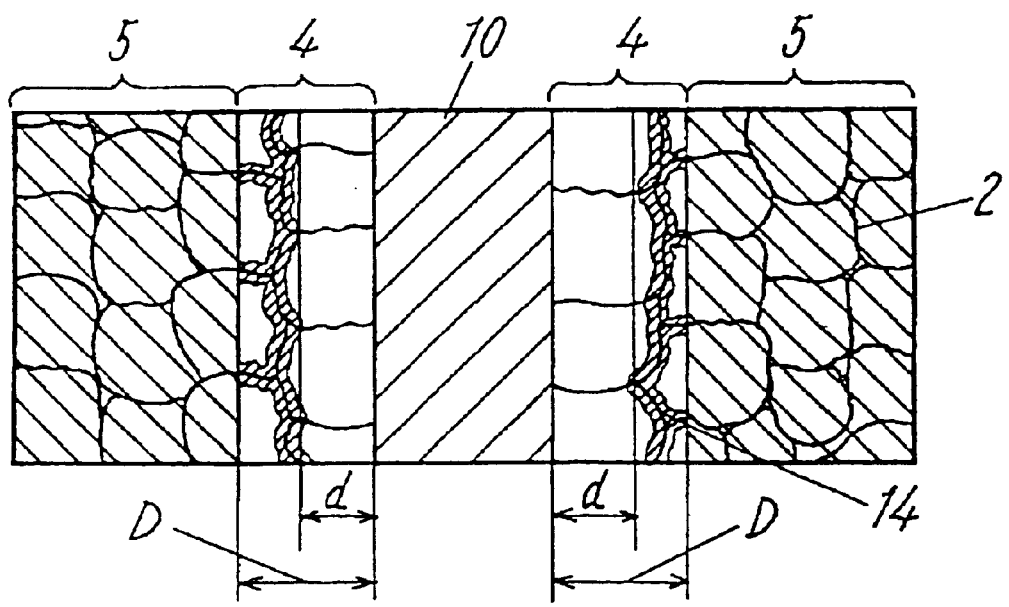
FIG. 1(b) is an enlarged top view of the TFT of FIG. 1(a).

As shown in FIG. 1(b), an advantage of the present invention is to set a length "D" of the low concentration region 4 not shorter than an average grain size of the polycrystal silicon film. For instance, an average grain size of polycrystal silicon film as the polycrystal semiconductor film 3 is controlled to be as fine as 1.0 $\mu$m, and the length "D" of the low concentration region 4 from the gate insulating film 9 is controlled not smaller than 1.1 $\mu$m. According to an exemplary embodiment, length "D" will be smaller than 2.0 $\mu$m.

The impurity 14 diffuses from the high concentration region 5 into the low concentration region 4 along the grain boundary when the heat treatment that activates the impurity is provided. In this case, this method allows a grain boundary parallel to the gate electrode 10 to restrain the diffusion from progressing toward the gate electrode. An effective length "d" of the low concentration region is thus restrained from being shorter, therefore, an OFF-current that is a TFT switching characteristic is decreased, and a leak current between the source and drain is restrained. As a result, monochrome display of each LCD pixel can be stable, and the micro brighter spots in gray-tone-display can be prevented from occurring.

In the TFT of the present invention, a semiconductor substrate on which an insulating film such as oxide silicon film is formed can replace the insulating substrate 1, and the polycrystal semiconductor film 3 is formed on the insulating film.

Figure 2:
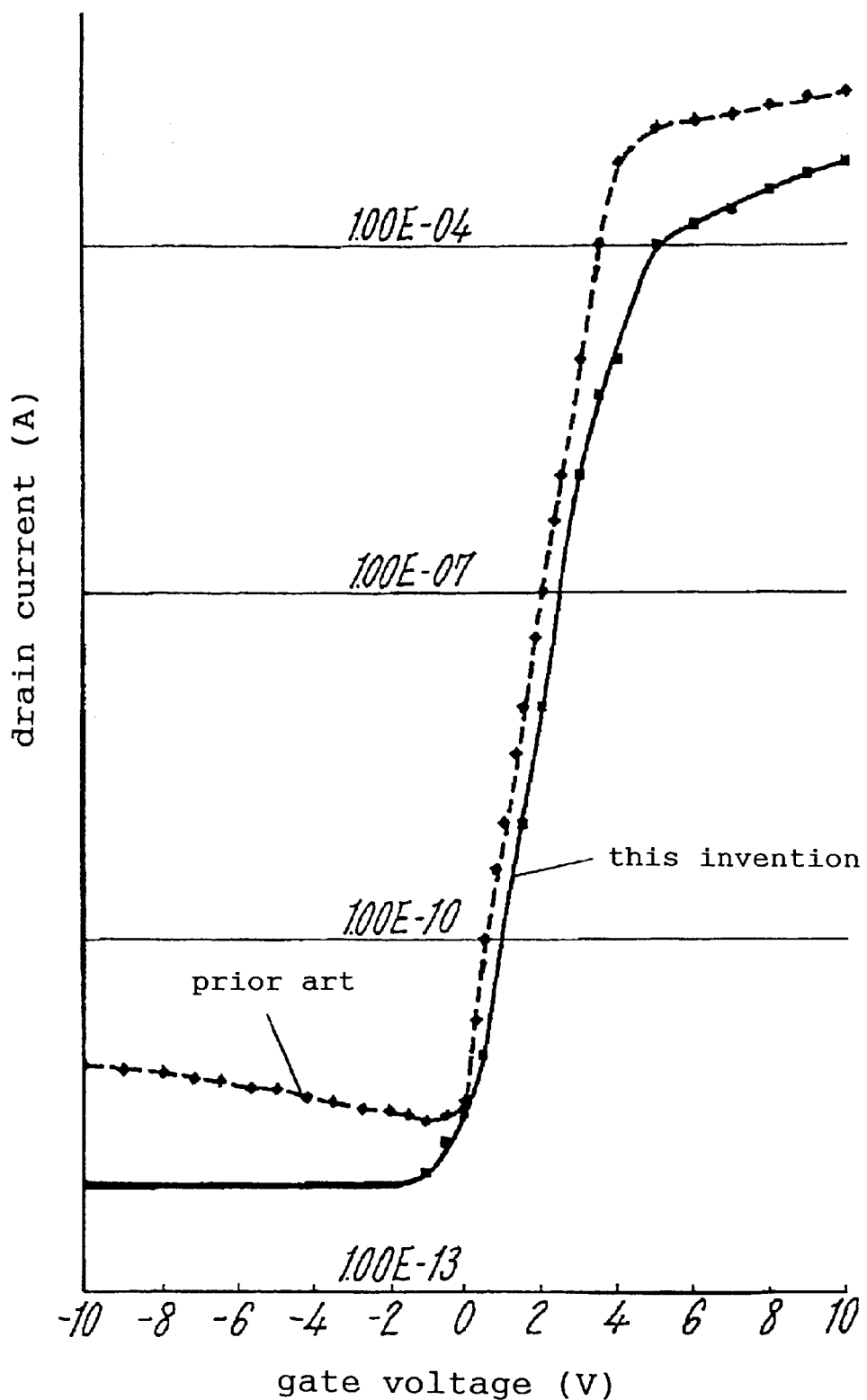
FIG. 2 shows a comparison chart between the TFT used in the exemplary embodiment of the present invention and a conventional TFT, where drain current characteristics with regard to a gate voltage of n-channel TFT are compared.
Figure 3A:
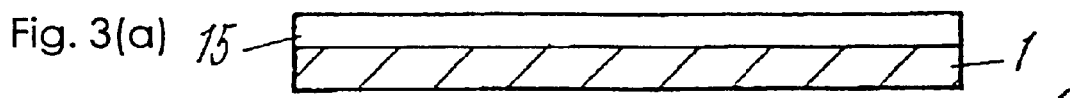
FIG. 3(a)–FIG. 3(g) are cross sections illustrating a manufacturing method of the TFT used in an exemplary embodiment of the present invention.
Figure 3B:
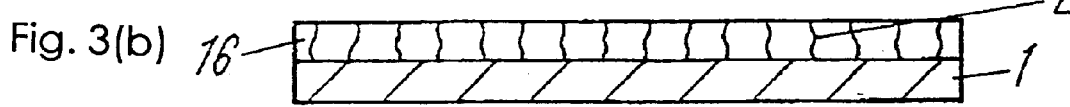
Figure 3C:
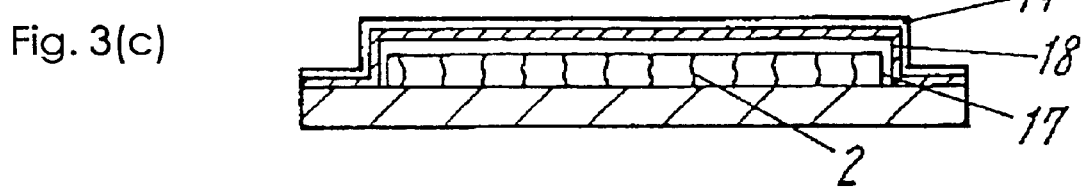
Figure 3D:
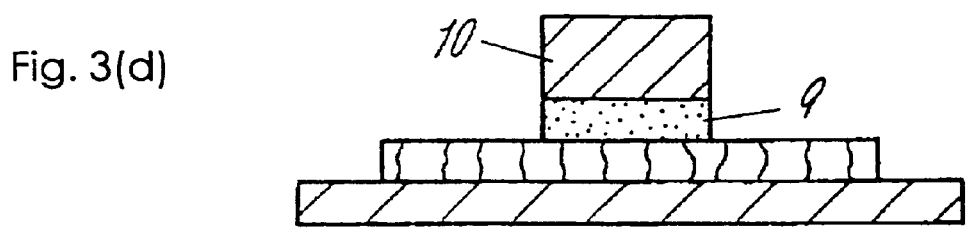
Figure 3E:
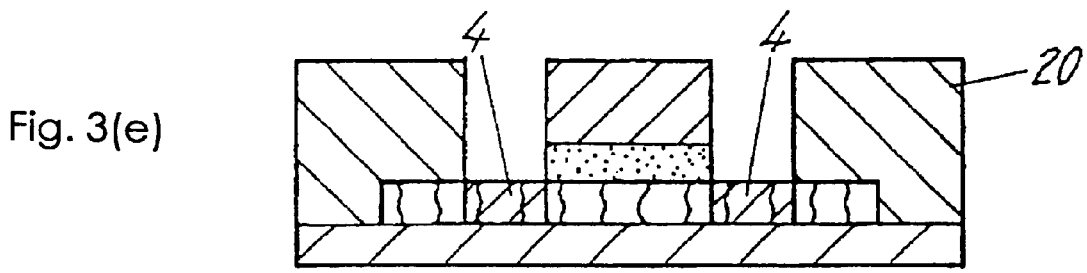
Figure 3F:
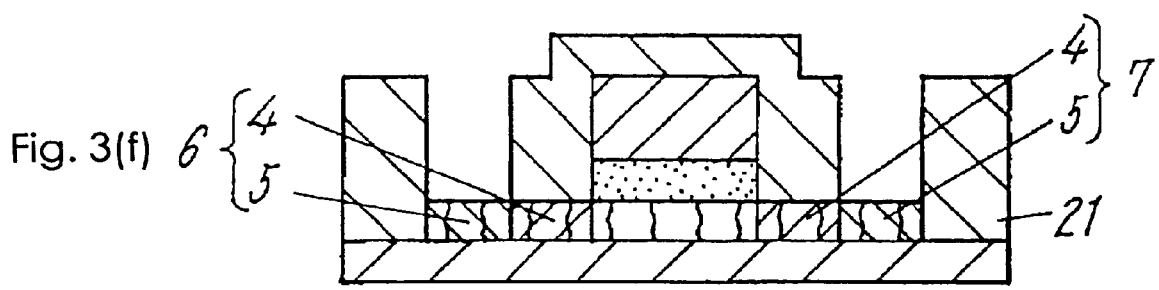
Figure 3G:
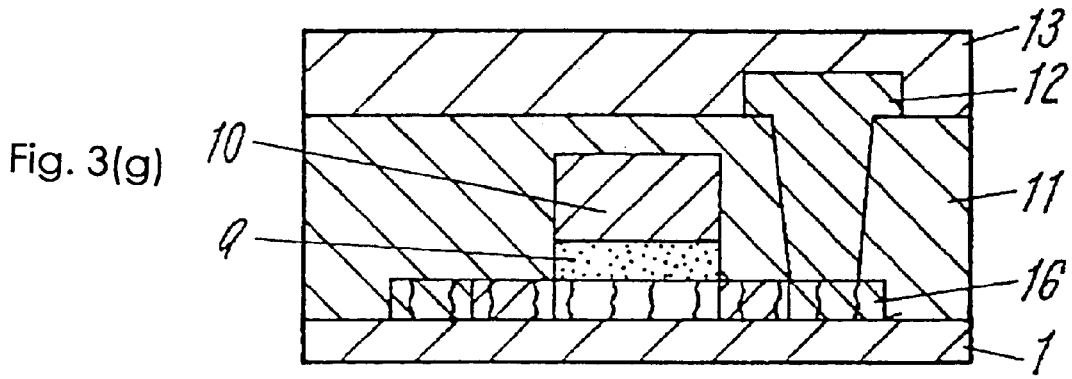
Figure 4A:
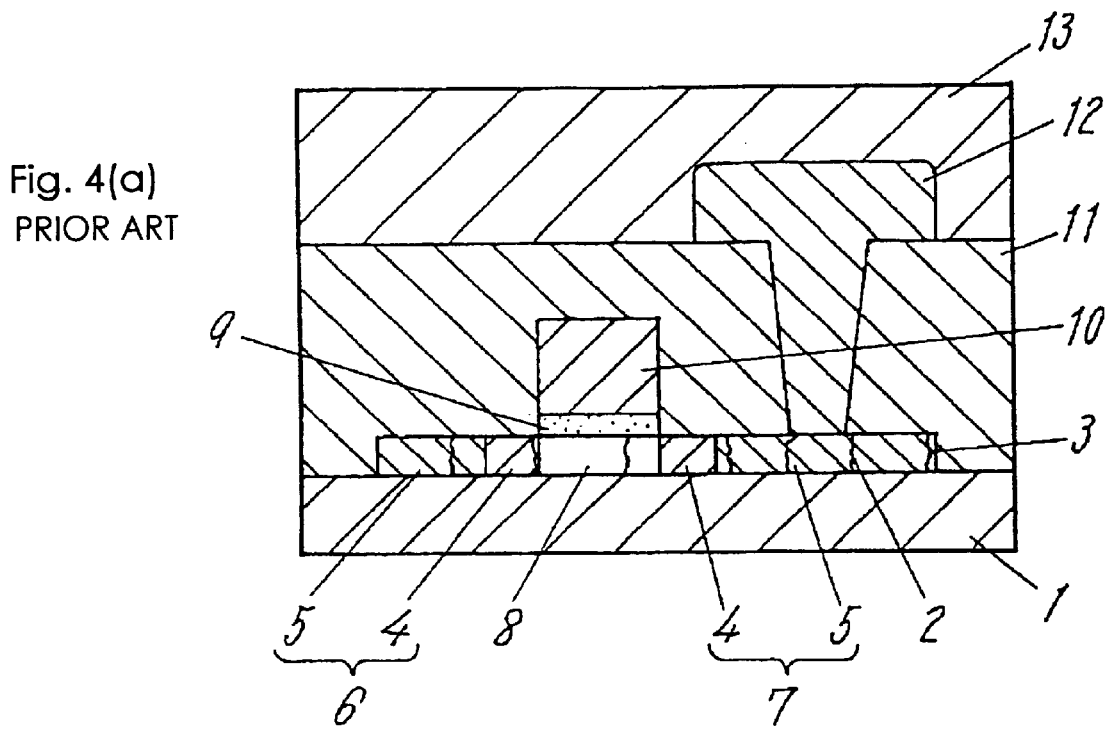
FIG. 4(a) is a cross section of the conventional TFT.
Figure 4B:
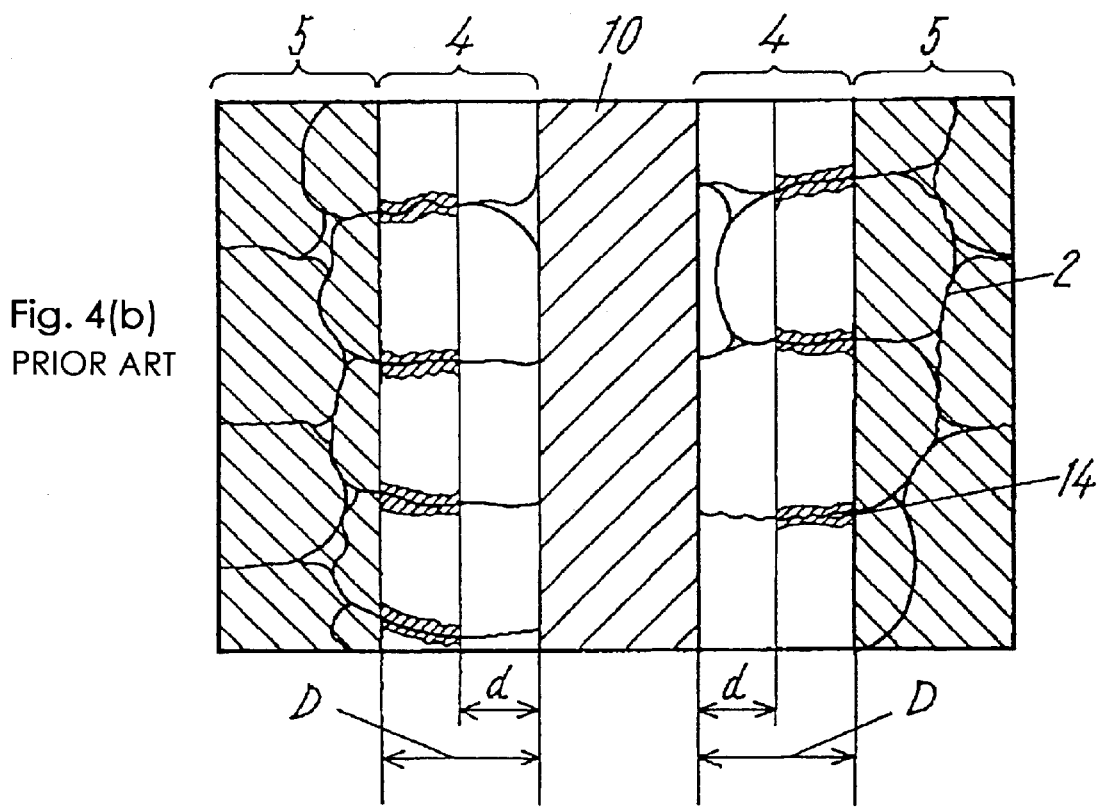
FIG. 4(b) is an enlarged top view of the TFT of FIG. 4(a).

FIG. 2 shows a comparison chart between the TFT used in an exemplary embodiment of the present invention and a conventional TFT, where drain current characteristics with regard to a gate voltage of n-channel TFT are compared. A solid line indicates the TFT of the present invention, and a broken line indicates the conventional TFT. As FIG. 2 shows, the drain current of the TFT used in this exemplary embodiment is less than that of the conventional TFT in the negative gate voltage area. In other words, the TFT of the present invention restrains the leakage current at an OFF state more effectively than the conventional TFT.

A manufacturing method of the TFT used in the exemplary embodiment of the present invention is described hereinafter with reference to FIG. 3(a)–FIG. 3(g).

First, form an amorphous silicon film 15 on the insulating substrate 1 made of e.g. quartz through the decompression chemical vapor deposition method. The film 15 is formed up to 90 nm thickness at the film growing rate of 1.7 nm/minute. [Refer to FIG. 3(a).]

Second, provide a heat treatment to the above substrate 1 on which the amorphous film 15 is formed under nitrogen atmosphere at 600° C. for 15 hours, thereby to promote the polycrystal solid phase to grow, and to change the film 15 into polycrystal silicon film 16 having the grain boundary 2. The grain size of this film 16 is as fine as 1.0±0.5 $\mu$m and the film itself has high homogeneity. [Refer to FIG. 3(b).]

Third, pattern the polycrystal silicon film 16 so that the TFT region (active region) is 2.2×2.2 $\mu$m, then oxidize this patterned film in oxygen atmosphere at 1100° C. This surface oxidization makes the film thickness of the original film 16 ranging from 50 to 55 nm, and a first gate oxide film 17 of which oxide film thickness is ca. 50 nm is thus obtained. Then, form a nitride silicon film 18 on the film 17. Further, form an oxide film thereon so that a second gate oxide film 19 is obtained. A gate insulating film 9 having an ONO film structure is thus obtained. [Refer to FIG. 3(c).]

Fourth, form a polycrystal silicon film through the decompression chemical vapor deposition method, then dope phosphorous into this film, and pattern the gate electrode 10 so that a gate length of the TFT is 3 $\mu$m. After this, pattern the gate insulating film 9. [Refer to FIG. 3(d).]

Fifth, apply an organic photosensitive film 20 (photo resist) across an area from the gate insulating film 9 to 1.1 $\mu$m distant with some opening area. This distance of 1.1 $\mu$m is longer than the average grain size, i.e. 1.0 $\mu$m. From the opening, implant phosphorous ion to form n-type low concentration region 4 that has a low impurity concentration. The amount of the implanted phosphorous ion is (8–10)× $10^{12}$ pieces/cm$^2$, preferably 9×$10^{12}$ pieces/cm$^2$. [Refer to FIG. 3(e).]

Further, apply another photo resist 21 having an opening after removing the photo resist 20. Then, implant phosphorous ion into the polycrystal silicon film 16 from the opening. The implanted ion amount is $(1-4) \times 10^{15}$ pieces/cm$^2$, and optimal amount is $2.3 \times 10^{15}$ pieces/cm$^2$, thereby to form a n-type high concentration region that has a high impurity concentration. [Refer to FIG. 3(f).]

Provide a heat treatment at 900° C. for 30 minutes in oxygen atmosphere for activating the source 6 and drain 7 thus formed.

Next, form an inter-layer insulating film 11 on the surface, and form an opening on the inter-layer insulating film 11. Then, form an electrode wiring layer 12 that is coupled to the n-type drain 7 through the opening. The electrode wiring layer 12 comprises a conductive film such as aluminum. Finally, form a passivation film 13 comprising oxide silicon film in order to retain humidity-proof of the TFT and the layer 12. [Refer to FIG. 3(g).]

Through the above steps, the TFT of the present invention is manufactured. The TFT has a small grain size, and its effective length of the low concentration region does not change substantially.

In the manufacturing method of the TFT of the present invention, a semiconductor substrate on which an insulating film e.g. an oxide silicon film is formed can replace the insulating substrate 1, and the polycrystal semiconductor film 3 is formed on the insulating film. The amorphous silicon film can be changed into the polycrystal silicon film also through a heat treatment by using LASER beam radiation. Further, in the step of forming the TFT, the pattern forming order as follows can be adopted:

First, form the gate electrode 10, then the gate insulating film 9 and finally, the polycrystal silicon film 16.

In this manufacturing method, since the length of low concentration region should be not smaller than the average grain size of the polycrystal silicon film, it is important to adjust the following conditions properly:

Film thickness of the polycrystal thin film;
Condition of growing the solid phase;
Length of the low concentration region;
Condition of heat treatment for activating the source and drain.

What is claimed is:

1. A thin film transistor comprising:

(a) one of an insulating substrate and a semiconductor substrate on which an insulating film is formed;

(b) polycrystal semiconductor thin film formed on one of said insulating substrate and said insulating film, and having a source and a drain in an LDD structure that has a low concentration region where impurity concentration is low as well as a high concentration region where impurity concentration is high;

(c) a gate insulating film formed on said polycrystal semiconductor thin film; and (d) a gate electrode formed on said gate insulating film, wherein a length of the low concentration region from the edge of gate insulating film is smaller than 2 μm and at least as large as an average grain size of said polycrystal semiconductor thin film.

2. A thin film transistor manufacturing method comprising the steps of:

(i) forming an amorphous semiconductor film on one of an insulating substrate and an insulating film formed on a semiconductor substrate;

(ii) forming a polycrystal semiconductor film by providing a heat treatment to the amorphous semiconductor film;

(iii) forming a gate insulating film and a gate electrode sequentially on the polycrystal semiconductor film;

(iv) forming a source and a drain both having low impurity concentration by implanting impurity ion into the polycrystal semiconductor film across an area from the edge of said gate insulating film to at least a distance of an average grain size but smaller than 2 μm, (v) forming said source and said drain both having high impurity concentration by implanting the same conductive type impurity ion as used in the low concentration region into the region other than the low concentration region; and (vi) providing a heat treatment for activating the source and the drain where ion has been implanted.

* * * * *